(12) United States Patent
Zou et al.

(10) Patent No.: US 10,885,854 B2
(45) Date of Patent: Jan. 5, 2021

(54) GATE DRIVE CIRCUIT, CONTROL METHOD THEREOF, AND DISPLAY DEVICE

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Yifeng Zou, Beijing (CN); Hui Wang, Beijing (CN); Qiang Liu, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/390,956

(22) Filed: Apr. 22, 2019

(65) Prior Publication Data

US 2020/0090594 A1 Mar. 19, 2020

(30) Foreign Application Priority Data

Sep. 13, 2018 (CN) .......................... 2018 1 1070561

(51) Int. Cl.
| | | |
|---|---|---|
| *G09G 3/3266* | (2016.01) | |
| *G09G 3/3225* | (2016.01) | |
| *G09G 3/36* | (2006.01) | |
| *G11C 19/28* | (2006.01) | |

(52) U.S. Cl.
CPC ......... *G09G 3/3266* (2013.01); *G09G 3/3225* (2013.01); *G09G 3/3677* (2013.01); *G09G 3/3696* (2013.01); *G11C 19/28* (2013.01); *G09G 2310/0286* (2013.01)

(58) Field of Classification Search
CPC .. G09G 3/3266; G09G 3/3225; G09G 3/3677; G09G 3/3696; G09G 2310/0286; G09G 2310/0267; G09G 3/3208; G11C 19/28
See application file for complete search history.

(56) References Cited

U.S. PATENT DOCUMENTS

| | | | | |
|---|---|---|---|---|
| 9,275,589 B2* | 3/2016 | Hu | ........ | G09G 3/3611 |
| 9,330,782 B2* | 5/2016 | Yamamoto | ............. | G11C 19/28 |
| 10,437,375 B2* | 10/2019 | Fan | ........ | G06F 3/0416 |
| 2002/0041266 A1* | 4/2002 | Koyama | ............. | G09G 3/3648 |
| | | | | 345/87 |
| 2004/0160432 A1* | 8/2004 | Kubota | ................ | G09G 3/3266 |
| | | | | 345/204 |

(Continued)

*Primary Examiner* — Jose R Soto Lopez
(74) *Attorney, Agent, or Firm* — Kinney & Lange, P.A.

(57) ABSTRACT

A gate drive circuit, a control method thereof, and a display device are disclosed. The gate drive circuit includes a plurality of cascaded shift registers, and at least one coded control sub-circuit; wherein each stage of the shift registers is configured to transmit a received signal to a next stage of the shift registers and the coded control sub-circuit. The coded control sub-circuit is configured to receive a coded signal, and transmit a voltage at the first voltage terminal or the second voltage terminal to the drive signal output terminal according to a signal output from a shift register coupled to the control sub-circuit under the control of the coded signal.

16 Claims, 9 Drawing Sheets

(56) References Cited

U.S. PATENT DOCUMENTS

| | | | |
|---|---|---|---|
| 2005/0068278 A1* | 3/2005 | Ito | G09G 3/3677 345/87 |
| 2007/0103346 A1* | 5/2007 | Liu | G09G 3/3674 341/50 |
| 2008/0165112 A1* | 7/2008 | Su | G09G 3/3677 345/100 |
| 2009/0309820 A1* | 12/2009 | Chen | G09G 3/3677 345/87 |
| 2011/0122122 A1* | 5/2011 | Chen | G09G 3/3688 345/213 |
| 2011/0128269 A1* | 6/2011 | Lee | G09G 3/20 345/211 |
| 2011/0148853 A1* | 6/2011 | Ko | G11C 19/28 345/213 |
| 2013/0127752 A1* | 5/2013 | Takeuchi | G09G 3/3614 345/173 |
| 2013/0127779 A1* | 5/2013 | Lillie | G06F 3/0416 345/174 |
| 2014/0285409 A1* | 9/2014 | Tanikame | G09G 3/3233 345/76 |
| 2015/0154902 A1* | 6/2015 | Lee | G09G 3/20 345/213 |
| 2016/0133184 A1* | 5/2016 | Gupta | G09G 3/3233 345/690 |
| 2016/0148556 A1* | 5/2016 | Tseng | G09G 3/3677 345/55 |
| 2016/0188091 A1* | 6/2016 | Sun | G06F 3/04166 345/174 |
| 2016/0259455 A1* | 9/2016 | Li | G06F 3/0416 |
| 2017/0039950 A1* | 2/2017 | Li | G09G 3/3266 |
| 2017/0061912 A1* | 3/2017 | Kitayama | G09G 3/3688 |
| 2017/0116945 A1* | 4/2017 | Cho | G09G 3/3688 |
| 2017/0154572 A1* | 6/2017 | Kim | G09G 3/3233 |
| 2017/0200418 A1* | 7/2017 | Zhang | G11C 19/28 |
| 2017/0213499 A1* | 7/2017 | Kong | G09G 3/3677 |
| 2017/0330525 A1* | 11/2017 | Choi | G09G 3/2092 |
| 2018/0090088 A1* | 3/2018 | He | H03K 19/20 |
| 2018/0330655 A1* | 11/2018 | Tsuchi | G09G 3/3225 |
| 2019/0180691 A1* | 6/2019 | Takasugi | G09G 3/3233 |
| 2020/0020280 A1* | 1/2020 | Han | G09G 3/3291 |

* cited by examiner

GATE DRIVE CIRCUIT, CONTROL METHOD THEREOF, AND DISPLAY DEVICE

CROSS-REFERENCE TO RELATED APPLICATION(S)

This application claims priority to Chinese Application No. 201811070561.3, entitled "GATE DRIVE CIRCUIT, CONTROL METHOD THEREOF, AND DISPLAY DEVICE" and filed on Sep. 13, 2018, which is incorporated herein by reference in its entirety.

TECHNICAL FIELD

The present disclosure relates to the field of display technologies, and in particular, to a gate drive circuit, a control method thereof, and a display device.

BACKGROUND

A TFT-LCD (Thin Film Transistor Liquid Crystal Display) or an OLED (Organic Light Emitting Diode) display device, which is a flat panel display device, is increasingly being applied in the field of high-performance displays because of its characteristics, such as a smaller size, lower power consumption, no radiation and a relatively low manufacture cost.

The gate line of the TFT-LCD or OLED display device may be driven by a GOA (Gate Driver on Array) circuit. In the related art, the holding time of the valid signal (for example, a low level or a high level) in the output signal of the GOA circuit is usually not changeable, and thus cannot be flexibly adjusted according to the needs of the user.

SUMMARY

In an aspect of embodiments of the present disclosure, a gate drive circuit is provided. The gate drive circuit includes a plurality of cascaded shift registers and at least one coded control sub-circuit; wherein each stage of the shift registers is configured to transmit a received signal to a next stage of the shift registers and the coded control sub-circuit; and wherein the coded control sub-circuit is further coupled to a first voltage terminal, a second voltage terminal, and a drive signal output terminal; and the coded control sub-circuit is configured to receive a coded signal, and transmit a voltage at the first voltage terminal or the second voltage terminal to the drive signal output terminal according to a signal output from a shift register coupled to the control sub-circuit under the control of the coded signal.

In some embodiments of the present disclosure, the coded control sub-circuit includes a strobe sub-circuit and an output sub-circuit; the strobe sub-circuit is coupled to the plurality of cascaded shift registers; and wherein the strobe sub-circuit is configured to receive the coded signal, and transmit a signal output from at least one of the plurality of cascaded shift registers to the output sub-circuit under the control of the coded signal; and the output sub-circuit is coupled to the first voltage terminal, the second voltage terminal and the drive signal output terminal; and the output sub-circuit is configured to transmit the voltage at the first voltage terminal or the second voltage terminal to the drive signal output terminal according to the signal output from the strobe sub-circuit.

In some embodiments of the present disclosure, each of the shift registers has a first output terminal and a second output terminal; the strobe sub-circuit includes a first strobe sub-circuit and a second strobe sub-circuit; and the output sub-circuit includes a first output sub-circuit and a second output sub-circuit; the first strobe sub-circuit is coupled to a first output terminal of each of the plurality of cascaded shift registers and the first output sub-circuit; and the first strobe sub-circuit is configured to transmit a signal output from the first output terminal of the at least one of the plurality of cascaded shift registers to the first output sub-circuit according to the coded signal; the second strobe sub-circuit is coupled to a second output terminal of each of the plurality of cascaded shift registers and the second output sub-circuit; and the second strobe sub-circuit is configured to transmit a signal output from the second output terminal of the at least one of the plurality of cascaded shift registers to the second output sub-circuit according to the coded signal; the first output sub-circuit is coupled to the first voltage terminal and the drive signal output terminal; and the first output sub-circuit is configured to transmit the voltage at the first voltage terminal to the drive signal output terminal according to a signal output from the first strobe sub-circuit; the second output sub-circuit is coupled to the second voltage terminal and the drive signal output terminal; and the second output sub-circuit is configured to transmit the voltage at the second voltage terminal to the drive signal output terminal according to a signal output from the second strobe sub-circuit.

In some embodiments of the present disclosure, the coded control sub-circuit is further coupled to a plurality of data signal lines, the plurality of data signal lines being configured to receive coded data, respectively, and the coded data respectively received by the plurality of data signal lines being arranged in parallel to form a parallel coded signal.

In some embodiments of the present disclosure, the gate drive circuit further includes a serial-to-parallel sub-circuit; the serial-to-parallel sub-circuit is coupled to the plurality of data signal lines, respectively; and the serial-to-parallel sub-circuit is configured to receive a serial coded signal, convert the serial coded signal into the parallel coded signal, and transmit the plurality of coded data in the parallel coded signal to the plurality of data signal lines, respectively.

In some embodiments of the present disclosure, each of the shift registers has a first output terminal and a second output terminal, the strobe sub-circuit includes a first strobe sub-circuit and a second strobe sub-circuit, and the output sub-circuit includes a first output sub-circuit and a second output sub-circuit, the plurality of cascaded shift registers include n shift registers cascaded sequentially; and wherein the plurality of data signal lines include 2n data signal lines; the first strobe sub-circuit includes n transistors; a k-th transistor of the n transistors in the first strobe sub-circuit has a gate coupled to a k-th data signal line of the 2n data signal lines, a first electrode coupled to a first output terminal of a k-th shift register of the n shift registers, and a second electrode coupled to the first output sub-circuit; the second strobe sub-circuit includes n transistors; a k-th transistor of the n transistors in the second strobe sub-circuit has a gate coupled to an (n+k)-th data signal line of the 2n data signal lines, a first electrode coupled to a second output terminal of a k-th shift register of the n shift registers, and a second electrode coupled to the second output sub-circuit, where n is a positive integer, k=1~n.

In some embodiments of the present disclosure, the first output sub-circuit includes a first output transistor; the first output transistor has a gate coupled to the first strobe sub-circuit, a first electrode coupled to the first voltage terminal, and a second electrode coupled to the drive signal output terminal; the second output sub-circuit includes a second output transistor; and the second output transistor has a gate coupled to the second gate sub-circuit, a first electrode coupled to the second voltage terminal, and a second electrode coupled to the drive signal output terminal.

In some embodiments of the present disclosure, the output sub-circuit further includes a storage capacitor, one terminal of the storage capacitor being coupled to the ground, and the other terminal thereof being coupled to the drive signal output terminal.

In some embodiments of the present disclosure, in the plurality of cascaded shift registers of the gate drive circuit, a signal input terminal of a first-stage shift register is coupled to a start signal terminal; a signal input terminal of each of other shift registers than the first-stage shift register is coupled to a signal output terminal of a previous-stage shift register; a reset signal terminal of a last-stage shift register is adapted to receive a reset signal or to be coupled to the start signal terminal; and a reset signal terminal of each of other shift registers than the last-stage shift register is coupled to a signal output terminal of a next-stage shift register.

In some embodiments of the present disclosure, each stage of the shift registers in the gate drive circuit has a first clock signal terminal and a second clock signal terminal; the first clock signal terminal of one of two adjacent and cascaded shift registers is coupled to a first system clock signal terminal, and the second clock signal terminal of the one shift register is coupled to a second system clock signal terminal; and the first clock signal terminal of the other of the two adjacent and cascaded shift registers is coupled to the second system clock signal terminal, and the second clock signal terminal of the other shift register is coupled to the first system clock signal terminal. A clock signal output from the first system clock signal terminal has the same period and opposite phase to a clock signal output from the second system clock signal terminal.

In another aspect of the present disclosure, a display device is provided, which includes any of the gate drive circuits as described previously.

In some embodiments of the present disclosure, the display device comprises a plurality of gate lines and a plurality of any of the gate drive circuits as described previously, and the drive signal output terminals of the plurality of gate drive circuits are sequentially coupled to the plurality of gate lines one by one.

In some embodiments of the present disclosure, the display device comprises a plurality of sub-pixels, each of which is provided with a pixel circuit; the pixel circuit has a first scan signal terminal and a light emission control signal terminal; and the first scan signal terminal and the light emission control signal terminal of the same pixel circuit are respectively coupled to the drive signal output terminals of two adjacent gate drive circuits.

In some embodiments of the present disclosure, the display device comprises a plurality of sub-pixels, each of which is provided with a pixel circuit; the pixel circuit has a first scan signal terminal, a second scan signal terminal and a light emission control signal terminal; and the first scan signal terminal, the second scan signal terminal and the light emission control signal terminal of the same pixel circuit are sequentially coupled to drive signal output terminals of three adjacent gate drive circuits, respectively.

In another aspect of the present disclosure, a method of controlling any of the gate drive circuits as described previously is provided. The method includes: providing a start signal to a signal input terminal of a first-stage shift register, and transmitting, by each stage of the shift registers, a received signal to the next stage of the shift registers and the coded control sub-circuit; receiving a coded signal by the coded control sub-circuit; and transmitting, by the coded control sub-circuit, the voltage at the first voltage terminal or the second voltage terminal to the drive signal output terminal according to the received signal output from the shift register under the control of the coded signal.

BRIEF DESCRIPTION OF THE DRAWINGS

In order to more clearly illustrate the technical solutions in the embodiments of the present disclosure or in the prior art, the drawings used in description of the embodiments or the prior art will be briefly described below. Obviously, the drawings in the following description illustrate only certain embodiments of the present disclosure, and other drawings may be obtained from the drawings without any creative effort for the skilled in the art.

DETAILED DESCRIPTION

Hereinafter, the technical solutions of the embodiments of the present disclosure will be described clearly and completely with reference to the drawings in the embodiments of the present disclosure. It is obvious that the described embodiments are only a part but not all of the embodiments of the present disclosure. All other embodiments that may be obtained by the skilled in the art without any creative effort based on the embodiments of the present disclosure fall into the scope of the present disclosure.

In the following, the terms "first" and "second" are used for description only, and are not to be construed as indicating or implying a relative importance or implicitly indicating the number of technical features indicated. Thus, features defined by "first" and "second" may include one or more of the features explicitly or implicitly. In the description of the embodiments of the present disclosure, "plurality of" means two or more, unless otherwise stated.

Figure 1:
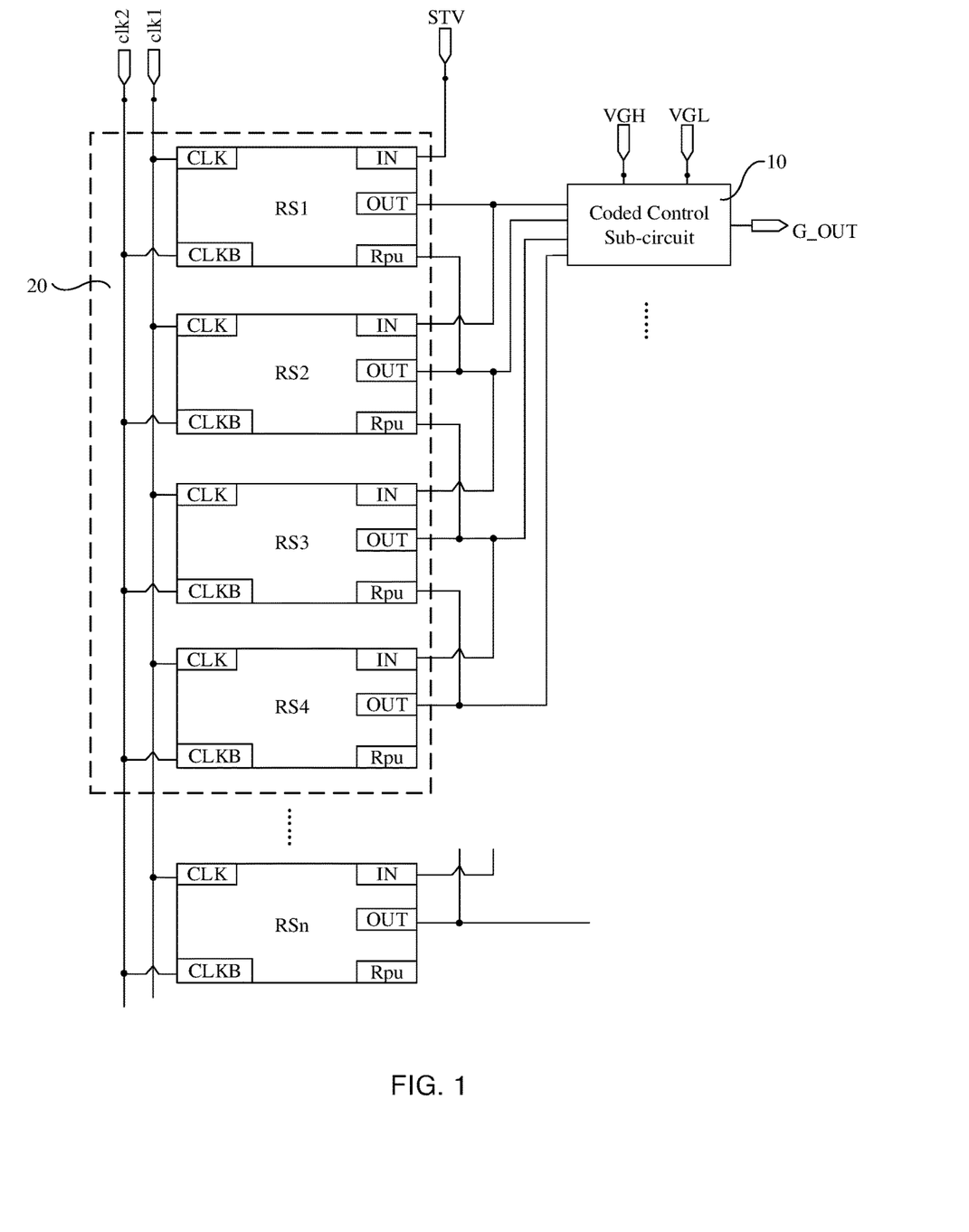
FIG. 1 is a schematic structure diagram of a gate drive circuit according to some embodiments of the present disclosure.

Some embodiments of the present disclosure provide a gate drive circuit including a plurality of cascaded shift registers (RS1, RS2, RS3 . . . ), as shown in FIG. 1.

In the plurality (for example, n, n≥2 and n is a positive integer) of cascaded shift registers RS1, RS2, RS3, . . . , RSn, a signal input terminal IN of the first-stage shift register RS1 is coupled to a start signal terminal STV.

In other shift registers than the first-stage shift register RS1, a signal output terminal OUT of a stage shift register is coupled to a signal input terminal IN of the next-stage shift register.

A reset signal terminal Rpu of the last-stage shift register RSn receives a reset signal. This reset signal may be provided by a separate reset signal terminal. Alternatively, the reset signal terminal Rpu of the last-stage shift register RSn may be coupled to the start signal terminal STV to provide the reset signal through the start signal terminal STV.

In other shift registers than the last-stage shift register RSn, the reset signal terminal Rpu of each of other shift registers than the last-stage shift register is coupled to the signal output terminal OUT of the next-stage shift register.

In this case, when the start signal terminal STV receives a valid start signal, the gate drive circuit enters a working state. At this time, the first-stage shift register RS1 performs shift register processing and transmits a signal at the start signal terminal STV to the input terminal IN of the second-stage shift register RS2; the second-stage shift register RS2 performs shift register processing and transmits the received signal to the third-stage shift register RS3 that is cascaded to the second-stage shift register RS2. The third-stage shift register RS3 and the remaining shift registers operate as described above, which will not be repeated here.

Additionally, in some embodiments of the present disclosure, as shown in FIG. 1, each stage of the shift registers in the gate drive circuit has a first clock signal terminal CLK and a second clock signal terminal CLKB.

The first clock signal terminal CLK of one (e.g., RS1) of two adjacent and cascaded shift registers is coupled to a first system clock signal terminal clk1, and the second clock signal terminal CLKB of the one shift register (e.g., RS1) is coupled to a second system clock signal terminal clk2.

The first clock signal terminal CLK of the other (e.g., RS2) of the two adjacent and cascaded shift registers is coupled to the second system clock signal terminal clk2, and the second clock signal terminal CLKB of the other shift register (e.g., RS2) is coupled to the first system clock signal terminal clk1.

A clock signal output from the first system clock signal terminal has the same period and opposite phase to a clock signal output from the second system clock signal terminal.

Based on this, at least two sequentially cascaded shift registers, for example, RS1, RS2, RS3, RS4, constitute one shift register group 20. The shift registers in any two shift register groups 20 are different.

In addition, the gate drive circuit further includes a plurality of coded control sub-circuits 10. The shift register group 20 corresponds to the coded control sub-circuit 10. All of the shift registers in the shift register group 20 are coupled to the coded control sub-circuit 10 corresponding to the shift register group 20.

In this case, a shift register is configured to transmit the received signal to the next-stage shift register and the coded control sub-circuit 10 coupled to the shift register. For example, the first-stage shift register RS1 performs shift register processing and transmits the signal received at the start signal terminal STV to the second-stage shift register RS2, and to the coded control sub-circuit 10 coupled to the first-stage shift register RS1.

In addition, as shown in FIG. 1, the coded control sub-circuit 10 is further coupled to the first voltage terminal VGH, the second voltage terminal VGL, and the drive signal output terminal G_OUT.

It should be noted that the first voltage terminal VGH is configured to output a constant high level; and the second voltage terminal VGL is configured to output a constant low level.

The coded control sub-circuit 10 is configured to receive a coded signal (CS for short), and under the control of the coded signal CS, to transmit the voltage at the first voltage terminal VGH or the second voltage terminal VGL to the above drive signal output terminal G_OUT according to the signal output from the shift register coupled to the coded control sub-circuit 10.

It should be noted that the skilled in the art may set the coded signal CS according to a time length of a duration in which a valid signal (e.g., a high level) is kept output from the drive signal output terminal G_OUT.

In summary, the gate drive circuit according to some embodiments of the present disclosure may transmit the input signal, such as a start signal STV received at the input terminal of the first-stage shift register, stage by stage through the plurality of cascaded shift registers, and the plurality of shift register groups 20 may output signals to the coded control sub-circuit 10 coupled to each of the shift register groups 20 one by one. In this case, the drive signal output terminal G_OUT coupled to the plurality of coded control sub-circuits 10 may sequentially output a drive signal to a signal line, such as a gate line, located in the display region.

In addition, the duration of the voltage at the first voltage terminal VGH or the duration of the voltage at the second voltage terminal VGL supplied from the coded control sub-circuit 10 to the drive signal output terminal G_OUT, may be controlled by the coded signal CS. The coded signal CS may be set by the user as needed. Therefore, the above gate drive circuit may provide a drive signal whose duration of a valid signal (for example, a high level or a low level) may be controlled to the signal line in the display region, such as the gate line, as needed, and the drive signal may be used as a gate drive signal.

Figure 2:
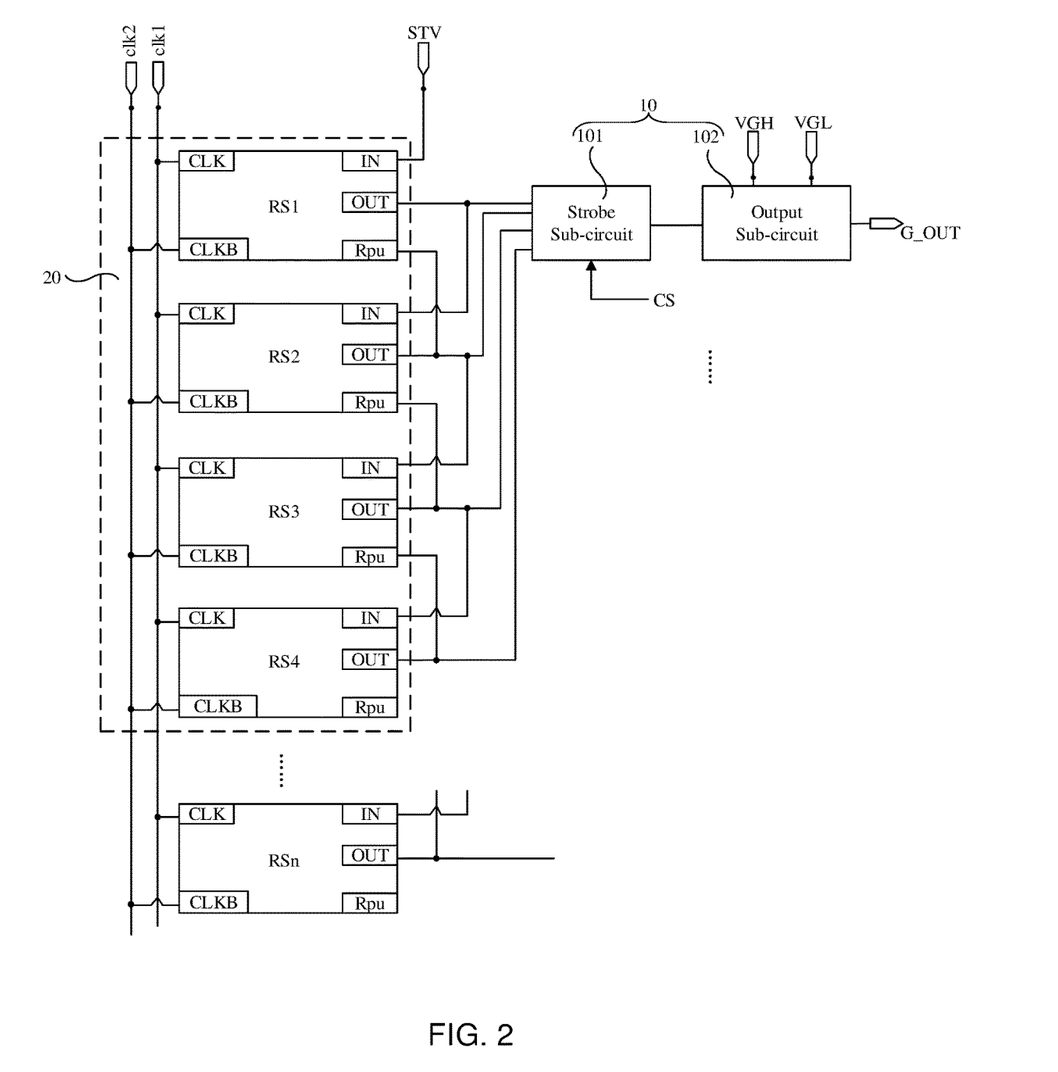
FIG. 2 is a schematic structure diagram of a coded control sub-circuit of FIG. 1.

The structure of the coded control sub-circuit 10 will be described in detail below. As shown in FIG. 2, the coded control sub-circuit 10 includes a strobe sub-circuit 101 and an output sub-circuit 102.

The strobe sub-circuit 101 is coupled to a shift register group 20, and the strobe sub-circuit 101 is configured to receive the coded signal CS, and output, under the control of the coded signal CS, a signal output from at least one shift register in the shift register group 20 to the output sub-circuit 102.

The output sub-circuit 102 is coupled to the first voltage terminal VGH, the second voltage terminal VGL, and the drive signal output terminal G_OUT. The output sub-circuit 102 is configured to transmit the voltage at the first voltage terminal VGH or the second voltage terminal VGL to the drive signal output terminal G_OUT according to the signal output from the strobe sub-circuit 101.

Figure 3:
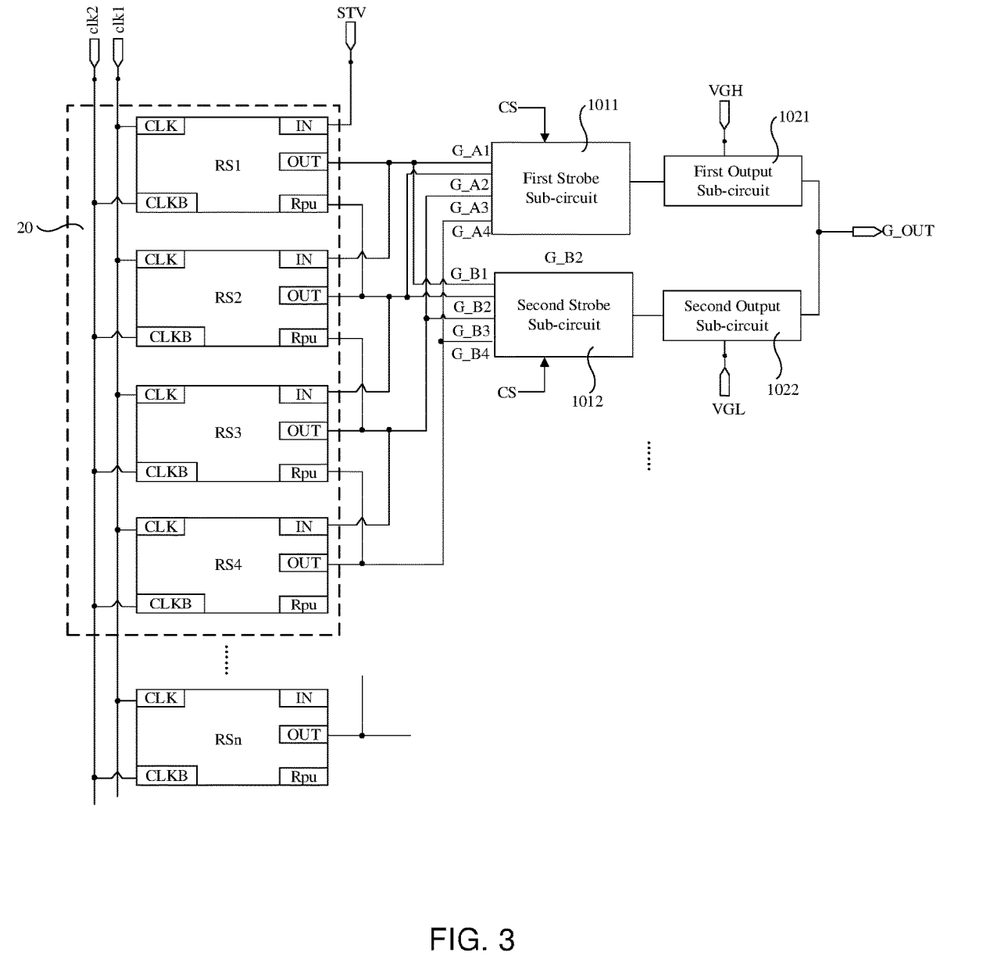
FIG. 3 is another schematic structure diagram of a coded control sub-circuit of FIG. 1.

In some embodiments of the present disclosure, as shown in FIG. 3, the signal output terminal OUT of each shift register includes a first output terminal G_A and a second output terminal G_B.

In this case, the above-described strobe sub-circuit 101 includes a first strobe sub-circuit 1011 and a second strobe sub-circuit 1012. In addition, the output sub-circuit 102 includes a first output sub-circuit 1021 and a second output sub-circuit 1022.

The first strobe sub-circuit 1011 is coupled to the first output terminal G_A of each shift register in the shift register group 20 and to the first output sub-circuit 1021. The first strobe sub-circuit 1011 is configured to transmit a signal output from the first output terminal G_A of at least one shift register in the shift register group 20 to the first output sub-circuit 1021 according to the coded signal CS.

The second strobe sub-circuit 1012 is coupled to the second output terminal G_B of each shift register in the shift register group 20 and to the second output sub-circuit 1022. The second strobe sub-circuit is configured to transmit a signal output from the second output terminal G_B of at least one shift register in the shift register group 20 to the second output sub-circuit 1012 according to the coded signal CS.

In addition, the first output sub-circuit 1021 is further coupled to the first voltage terminal VGH and the drive signal output terminal G_OUT. The first output sub-circuit 1021 is configured to transmit the voltage at the first voltage terminal VGH to the drive signal output terminal G_OUT according to the signal output from the first strobe sub-circuit 1011.

The second output sub-circuit 1022 is further coupled to the second voltage terminal VGL and the drive signal output terminal G_OUT. The second output sub-circuit 1022 is configured to transmit the voltage at the second voltage terminal VGL to the drive signal output terminal G_OUT according to the signal output from the second gate sub-circuit 1012.

In this case, the first strobe sub-circuit 1011 may control an On duration of the first output sub-circuit 1021 according to the coded signal CS. The second strobe sub-circuit 1012 may control an On duration of the second output sub-circuit 1022 according to the coded signal CS. In addition, a valid duration in which a high level (supplied from the first voltage terminal VGH) is being output from the drive signal output terminal G_OUT coupled to the first output sub-circuit 1021 depends on the On duration of the first output sub-circuit 1021. A valid duration in which a low level (supplied from the second voltage terminal VGL) is being output from the drive signal output terminal G_OUT coupled to the second output sub-circuit 1022 depends on the On duration of the second output sub-circuit 1022.

Figure 4:
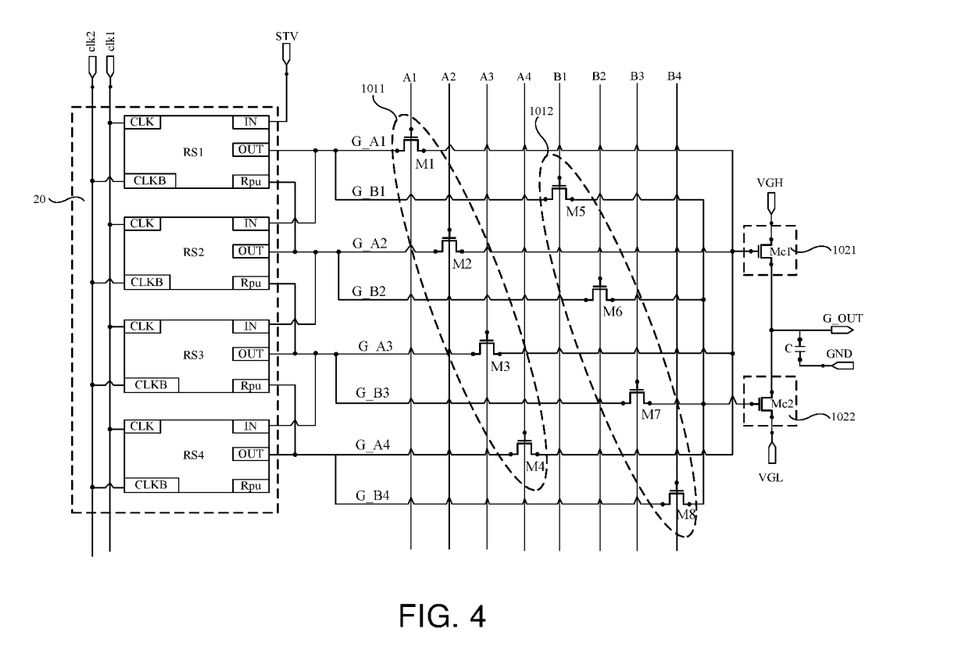
FIG. 4 is another schematic structure diagram of a coded control sub-circuit of FIG. 1.

In order to transmit the coded signal CS to the coded control sub-circuit 10, as shown in FIG. 4, the coded control sub-circuit 10 is further coupled to a plurality of data signal lines (A1, A2, A3, A4, B1, B2, B3, B4). Each of the plurality of data signal lines (A1, A2, A3, A4, B1, B2, B3, B4) is configured to receive coded data, and the coded data respectively received by the plurality of signal lines (A1, A2, A3, A4, B1, B2, B3, and B4) are arranged in parallel to form a parallel coded signal.

In this case, the coded signal CS transmitted to the coded control sub-circuit 10 may be a parallel coded signal, and the parallel coded signal CS includes multi-bit parallel coded data, such as 8-bit coded data: 10000100, 10000010, 10000001, etc. Each data signal line accepts one coded data, such as 0 or 1. In an embodiment of the present disclosure, "0" represents a low level, e.g., a voltage at the second voltage terminal VGL, or a voltage lower than that at the second voltage terminal VGL; "1" represents a high level, e.g., a voltage at the first voltage terminal VGH, or a voltage higher than that at the first voltage terminal VGH.

Figure 5:
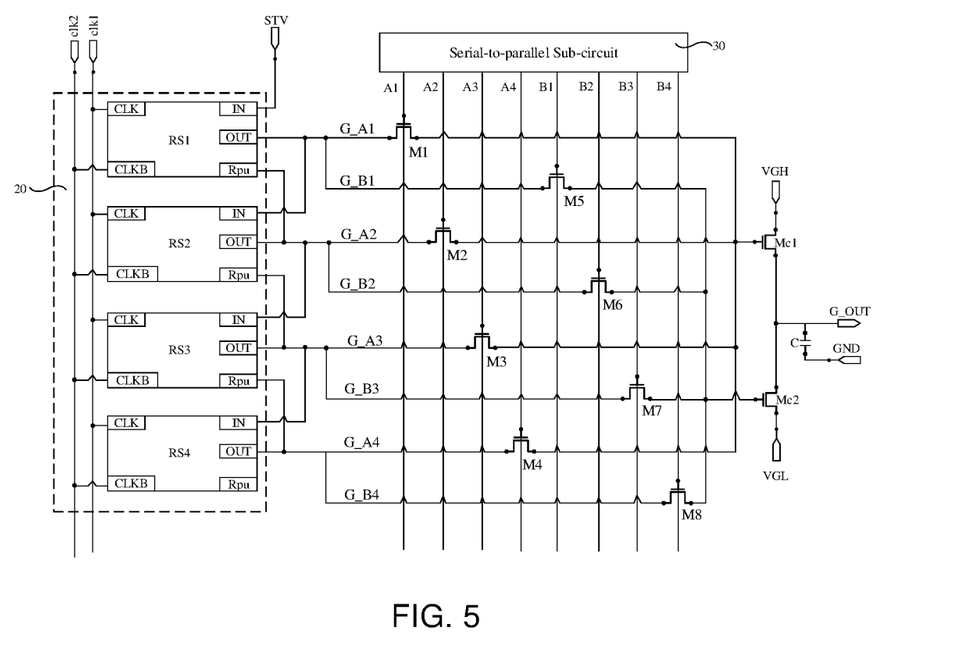
FIG. 5 is a schematic structure diagram of another gate drive circuit according to some embodiments of the present disclosure.

Alternatively, in a case where the coded signal CS transmitted to the coded control sub-circuit 10 is serial data, the gate drive circuit further includes a serial-to-parallel sub-circuit 30 as shown in FIG. 5.

In this case, the serial-to-parallel sub-circuit 30 is coupled to the plurality of data signal lines (A1, A2, A3, A4, B1, B2, B3, B4) respectively, and the serial-to-parallel sub-circuit 30 is configured to receive the serial coded signal via a serial interface, converts the received serial coded signal into a parallel signal, and transmits the plurality of coded data in the parallel signal to the plurality of data signal lines (A1, A2, A3, A4, B1, B2, B3, B4) respectively.

In some embodiments of the present disclosure, the serial-to-parallel sub-circuit 30 may be composed of a plurality of cascaded shift registers, which may output the coded data in the serial coded signal, so as to convert the serial coded data into a parallel coded signal.

In some embodiments of the present disclosure, in a case where each of the shift registers has a first output terminal and a second output terminal, the strobe sub-circuit comprises a first strobe sub-circuit and a second strobe sub-circuit, and the output sub-circuit comprises a first output sub-circuit and a second output sub-circuit, the plurality of cascaded shift registers include n shift registers cascaded sequentially; the plurality of data signal lines comprise 2n data signal lines. The first strobe sub-circuit comprises n transistors; a k-th transistor of the n transistors in the first strobe sub-circuit has a gate coupled to a k-th data signal line of the 2n data signal lines, a first electrode coupled to a first output terminal of a k-th shift register of the n shift registers, and a second electrode coupled to the first output sub-circuit. The second strobe sub-circuit comprises n transistors; a k-th transistor of the n transistors in the second strobe sub-circuit has a gate coupled to an (n+k)-th data signal line of the 2n data signal lines, a first electrode coupled to a second output terminal of a k-th shift register of the n shift registers, and a second electrode coupled to the second output sub-circuit, where n is a positive integer, k=1~n.

Hereinafter, by taking the shift register group including a first shift register (for example, RS1), a second shift register (for example, RS2), a third shift register (for example, RS3) and a fourth shift register (for example, RS4) as an example, in a case where each of the shift registers has a first output terminal G_A and a second output terminal G_B, the strobe sub-circuit 101 includes a first strobe sub-circuit 1011 and a second strobe sub-circuit 1012, and the output sub-circuit 102 includes a first output sub-circuit 1021 and a second output sub-circuit 1022, the structures of the first strobe sub-circuit 1011, the second strobe sub-circuit 1012, the first output sub-circuit 1021 and the second output sub-circuit 1022 will be described in detail.

As shown in FIG. 4, the plurality of data signal lines include a first data signal line A1, a second data signal line A2, a third data signal line A3, a fourth data signal line A4, a fifth data signal line B1, a sixth data signal line B2, a seventh data signal line B3, and an eighth data signal line B4.

In addition, as shown in FIG. 4, the first strobe sub-circuit 1011 includes a first transistor M1, a second transistor M2, a third transistor M3, and a fourth transistor M4.

The gate of the first transistor M1 is coupled to the first data signal line A1, the first electrode of M1 is coupled to the first output terminal G_A1 of the first shift register (for example, RS1), and the second electrode of M1 is coupled to the first output sub-circuit 1021.

The gate of the second transistor M2 is coupled to the second data signal line A2, the first electrode of M2 is coupled to the first output terminal G_A2 of the second shift register (for example, RS2), and the second electrode of M2 is coupled to the first output sub-circuit 1021.

The gate of the third transistor M3 is coupled to the third data signal line A3, the first electrode of M3 is coupled to the first output terminal G_A3 of the third shift register (for example, RS3), and the second electrode of M3 is coupled to the first output sub-circuit 1021.

The gate of the fourth transistor M4 is coupled to the fourth data signal line A4, the first electrode of M4 is coupled to the first output terminal G_A4 of the fourth shift register (for example, RS4), and the second electrode of M4 is coupled to the first output sub-circuit 1021.

The second strobe sub-circuit 1012 includes a fifth transistor M5, a sixth transistor M6, a seventh transistor M7, and an eighth transistor M8.

The gate of the fifth transistor M5 is coupled to the fifth data signal line B1, the first electrode of M5 is coupled to the second output terminal G_B1 of the first shift register (for example, RS1), and the second electrode of M5 is coupled to the second output sub-circuit 1022.

The gate of the sixth transistor M6 is coupled to the sixth data signal line B2, the first electrode of M6 is coupled to the second output terminal G_B2 of the second shift register (for example, RS2), and the second electrode of M6 is coupled to the second output sub-circuit 1022.

The gate of the seventh transistor M7 is coupled to the seventh data signal line B3, the first electrode of M7 is coupled to the second output terminal G_B3 of the third shift register (for example, RS3), and the second electrode of M7 is coupled to the second output sub-circuit 1022.

The gate of the eighth transistor M8 is coupled to the eighth data signal line B4, the first electrode of M8 is coupled to the second output terminal G_B4 of the fourth shift register (for example, RS4), and the second electrode of M8 is coupled to the second output sub-circuit 1022.

In addition, the first output sub-circuit 1021 includes a first output transistor Mc1. The gate of the first output transistor Mc1 is coupled to the first strobe sub-circuit 1011, the first electrode of Mc1 is coupled to the first voltage terminal VGH, and the second electrode of Mc1 is coupled to the drive signal output terminal G_OUT.

When the structure of the first strobe sub-circuit 1011 is as described above, the gate of the first output transistor Mc1 is coupled to the second electrodes of the first transistor M1, the second transistor M2, the third transistor M3, and the fourth transistor M4 in the first strobe sub-circuit 1011.

The second output sub-circuit 1022 includes a second output transistor Mc2. The gate of the second output transistor Mc2 is coupled to the second strobe sub-circuit 1012, the first electrode of Mc2 is coupled to the second voltage terminal VGL, and the second electrode of Mc2 is coupled to the drive signal output terminal G_OUT.

When the structure of the second strobe sub-circuit 1012 is as described above, the gate of the second output transistor Mc2 is coupled to the second electrodes of the fifth transistor M5, the sixth transistor M6, the seventh transistor M7, and the eighth transistor M8 in the second strobe sub-circuit 1012.

It should be noted that in the embodiments of the present disclosure, each of the above transistors may be an N-type transistor or a P-type transistor. For convenience of explanation, the following description will be made by taking the N-type transistors as an example. In addition, the first electrode of each of the above transistors is the source, and the second electrode thereof is the drain; or the first electrode thereof is the drain, and the second electrode thereof is the source.

In order to enable the drive signal output terminal G_OUT to output a signal stably, the output sub-circuit 101 is also coupled to the ground GND. In this case, the output sub-circuit 101 further includes a storage capacitor C as shown in FIG. 4. One terminal of the storage capacitor C is coupled to the ground GND, and the other terminal thereof is coupled to the drive signal output terminal G_OUT.

The storage capacitor C may store the signal output from the first output sub-circuit 1021 or the second output sub-circuit 1022, and continuously supply the signal to the drive signal output terminal G_OUT. When there is no new signal being supplied to the drive signal output terminal G_OUT at the next instant, the storage capacitor C may keep the drive signal output terminal G_OUT at the level output at the previous instant.

In this case, the first data signal line A1, the second data signal line A2, the third data signal line A3, and the fourth data signal line A4 may respectively control turn-on or turn-off of the first transistor M1, the second transistor M2, the third transistor M3 and the fourth transistor M4.

When any of the first data signal line A1, the second data signal line A2, the third data signal line A3 and the fourth data signal line A4 outputs a high level, the transistor controlled by the data signal line is turned on, so that the signal output from the first signal terminal G_A of the shift register coupled to the transistor is transmitted to the first output transistor Mc1.

In this case, when the first signal terminal G_A outputs a high level, the first output transistor Mc1 is turned on, and the high level at the first voltage terminal VGH is output to the drive signal output terminal G_OUT. When the first signal terminal G_A outputs a low level, the first output transistor Mc1 is turned off, and the storage capacitor C may keep the drive signal output terminal G_OUT at the level output at the previous instant.

Similarly, the fifth data signal line B1, the sixth data signal line B2, the seventh data signal line B3, and the eighth data signal line B4 may control turn-on or turn-off of the fifth transistor M5, the sixth transistor M6, the seventh transistor M7, and the eighth transistor M8.

When any of the fifth data signal line B1, the sixth data signal line B2, the seventh data signal line B3 and the eighth data signal line B4 outputs a high level, the transistor controlled by the data signal line is turned on, so that the signal output from the second signal terminal G_B of the shift register coupled to the transistor is transmitted to the second output transistor Mc2.

In this case, when the second signal terminal G_B outputs a high level, the second output transistor Mc2 is turned on, and the low level at the second voltage terminal VGL is output to the drive signal output terminal G_OUT. When the second signal terminal G_B outputs a low level, the second output transistor Mc2 is turned off, and the storage capacitor C may keep the drive signal output terminal G_OUT at the level output at the previous instant.

The operations of the above gate drive circuit will be exemplified below for different coded signals CSs.

Figure 6:
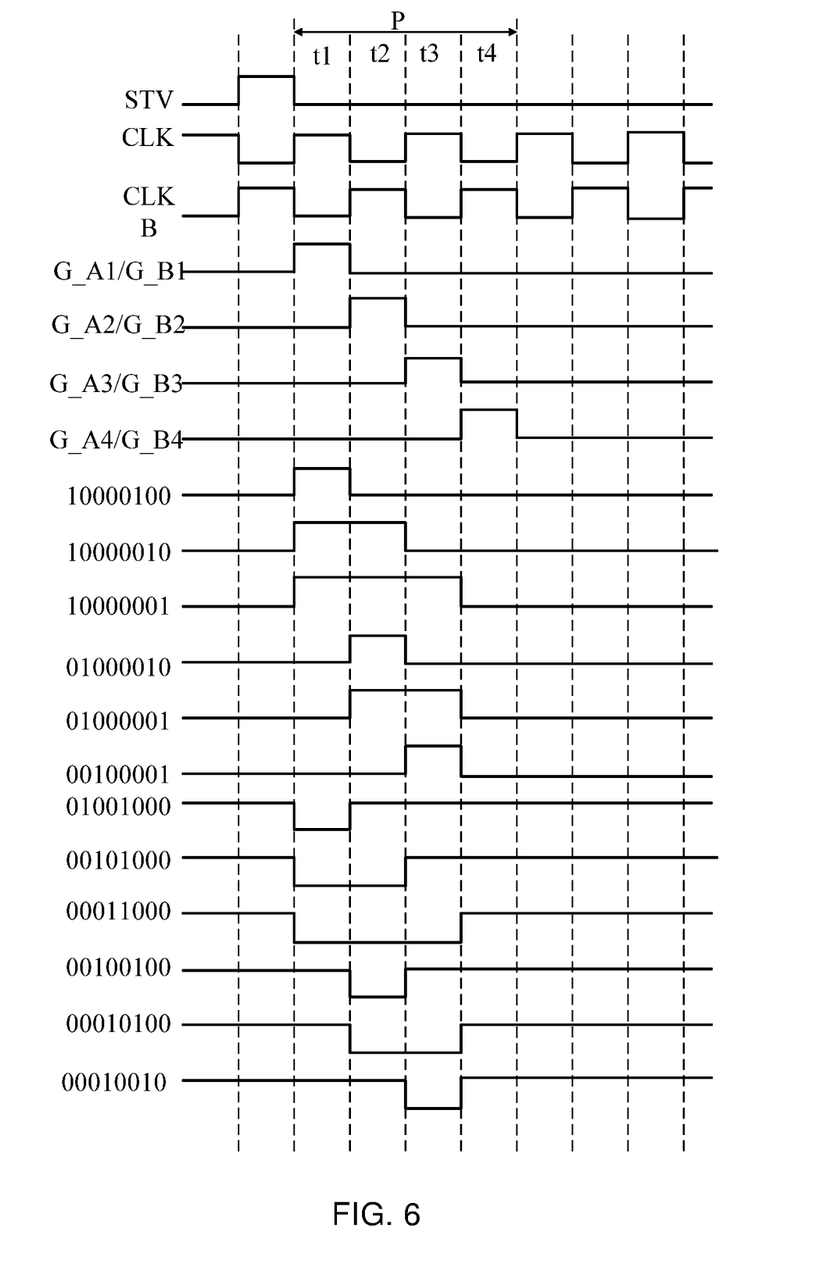
FIG. 6 is a signal control timing diagram according to some embodiments of the present disclosure.

For example, when the coded signal CS is 10000100 as shown in FIG. 6, the coded data received by the first data signal line A1, the second data signal line A2, the third data signal line A3, the fourth data signal line A4, the fifth data signal line B1, the sixth data signal line B2, the seventh data signal line B3, and the eighth data signal line B4 are 1, 0, 0, 0, 0, 1, 0, and 0, respectively.

In this case, in the Phase P, the first transistor M1 is turned on, and the second transistor M2, the third transistor M3, and the fourth transistor M4 are turned off. The fifth transistor M5, the seventh transistor M7 and the eighth transistor M8 are turned off, and the sixth transistor M6 is turned on.

At a first instant t1 of the Phase P, the signal output terminal OUT of the first shift register (for example, RS1) outputs a high level. The high level output from the first output terminal G_A1 of RS1 is transmitted to the gate of the first output transistor Mc1 through the first transistor M1. The first output transistor Mc1 is turned on. The high level at the first voltage terminal VGH is transmitted to the drive signal output terminal G_OUT.

In addition, the sixth transistor M6 is turned on. At the second instant t2 of the Phase P, the signal output terminal OUT of the second shift register (for example, RS2) coupled to the sixth transistor M6 outputs a high level. The high level output from the second output terminal G_B2 of RS2 is transmitted to the gate of the second output transistor Mc2 through the sixth transistor M6. The second output transistor Mc2 is turned on. The low level at the second voltage terminal VGL is transmitted to the drive signal output terminal G_OUT, so that the signal output from the drive signal output terminal G_OUT is pulled down at the second instant t2 of the Phase P.

In addition, since the remaining transistors in the strobe sub-circuit 101 are all in the off state, the first output transistor Mc1 and the second output transistor Mc2 are both in the off state at the third instant t3 and the fourth instant t4 even if both the third shift register (for example, RS3) and the fourth shift register (for example, RS4) output the high level at the third instant t3 and the fourth instant t4 respectively. At this time, under the effect of the storage capacitor C, the drive signal output terminal G_OUT is kept at the low level output at the second instant t2.

Therefore, when the coded signal CS is 10000100, the signal output from the drive signal output terminal G_OUT coupled to the shift register group 20 (including RS1, RS2, RS3, and RS4) is at the high level (valid signal) only at the first instant t1 of the Phase P.

For another example, similarly, when the coded signal CS is 10000010, the first transistor M1 and the seventh transistor M7 in the strobe sub-circuit 101 are turned on, and the remaining transistors are turned off. Therefore, as shown in FIG. 6, the signal output from the drive signal output terminal G_OUT is kept at a high level (valid signal) at the first instant t1 and the second instant t2 of the Phase P; and at the third instant t3, the high level output from the second output terminal G_B3 of the third shift register (for example, RS3) is transmitted to the second output transistor Mc2 through the seventh transistor M7, so that the signal output from the drive signal output terminal G_OUT is pulled down by the low level output from the second voltage terminal VGL.

For another example, similarly, when the coded signal CS is 10000001, the first transistor M1 and the eighth transistor M8 in the strobe sub-circuit 101 are turned on, and the remaining transistors are turned off. Therefore, as shown in FIG. 6, the signal output from the drive signal output terminal G_OUT is kept at a high level (valid signal) at the first instant t1, the second instant t2, and the third instant t3 of the Phase P. At the fourth instant t4, the high level output from the second output terminal G_B4 of the fourth shift register (for example, RS4) is transmitted to the second output transistor Mc2 through the eighth transistor M8, so that the signal output from the drive signal output terminal G_OUT is pulled down by the low level output from the second voltage terminal VGL.

The durations corresponding to the remaining coded signals CSs in which the drive signal output terminal G_OUT outputs the high level are shown in FIG. 6. The principle is the same as above, and details will not be described here again.

As may be seen from the above, the duration in which the drive signal output terminal G_OUT outputs the high level may be adjusted by setting the coded signal CS to meet different requirements.

The above description is based on the example in which one shift register group 20 includes four shift registers (RS1, RS2, RS3, and RS4), and each shift register has two clock signal terminals (CLK, CLKB). In this case, the duration in which the drive signal output terminal G_OUT outputs the high level may be delayed to a maximum of 3 H. One H is the length of half of the period of the clock signal.

In order to improve the accuracy and the range of adjusting the duration of the high level output from the drive signal output terminal G_OUT, for example, adjusting the accuracy to be extendable or reducible by 0.5 H each time, adjusting the range to be extendable to 6 H, the number of clock signal terminals in each shift register and the number of bits of coded data in the coded signal may be appropriately increased in some embodiments of the present disclosure.

Some embodiments of the present disclosure provide a display device including any of the gate drive circuits as described above. The display device has the same technical effects as the gate drive circuit provided in the foregoing embodiment, and details will not be described here again.

Figure 7:
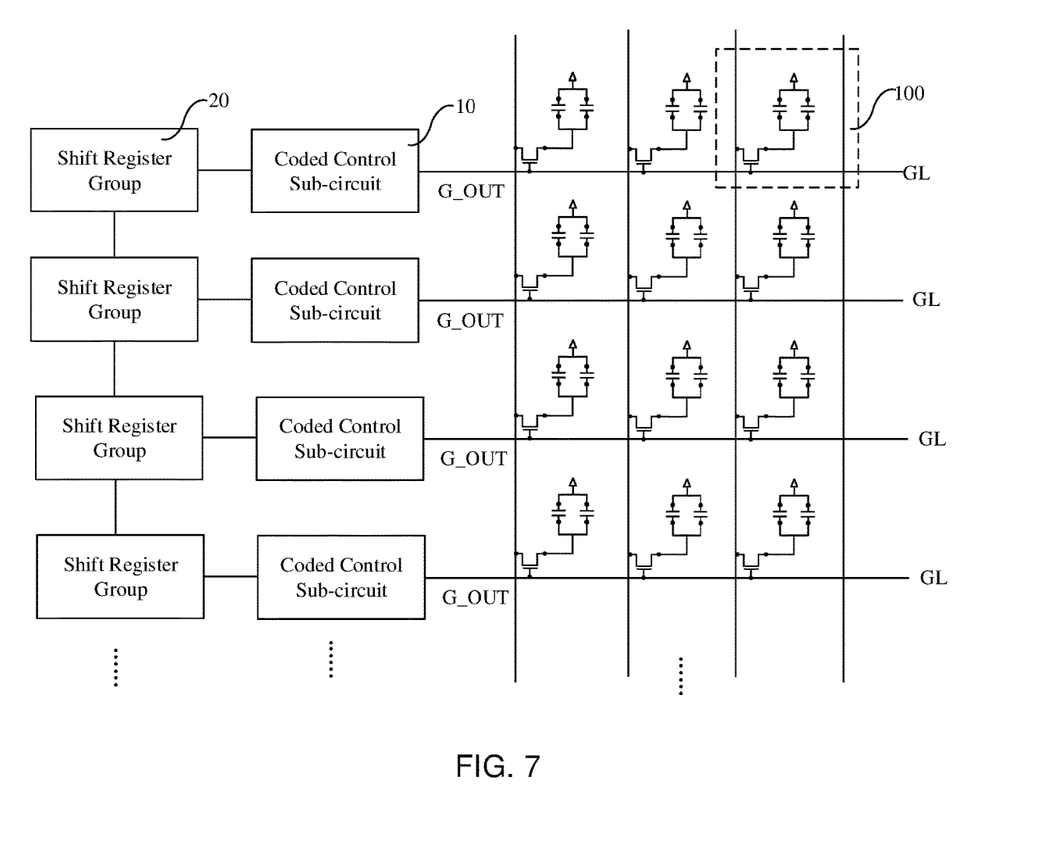
FIG. 7 is a schematic structure diagram of a display device according to some embodiments of the present disclosure.

In some embodiments of the present disclosure, the display device is a liquid crystal display device, which comprises a plurality of gate lines GL in a display region of the liquid crystal display device as shown in FIG. 7. The drive signal output terminals G_OUT of the plurality of code control sub-circuits 10 are sequentially coupled to the plurality of gate lines GL one by one.

For the liquid crystal display device, the duration of the valid signal (for example, the high level) that is output from the drive signal output terminal G_OUT and is received by one gate line GL may determine the duration in which one row of sub-pixels 100 controlled by the gate line GL is charged. For liquid crystal display devices with different resolutions, the numbers of sub-pixels 100 controlled by one row of gate lines GL are different, and thus the charging durations of one row of sub-pixels 100 are also different. It may be seen from the above that the duration of the valid signal (for example, the high level) provided by the gate drive circuit according to the embodiments of the present disclosure to the gate line GL may be adjusted according to the input coded signal. Therefore, the gate drive circuit according to the present disclosure is applicable for the display devices with different resolutions. The process of setting the coded signal is the same as described above, and details will not be described here again.

Figure 8:
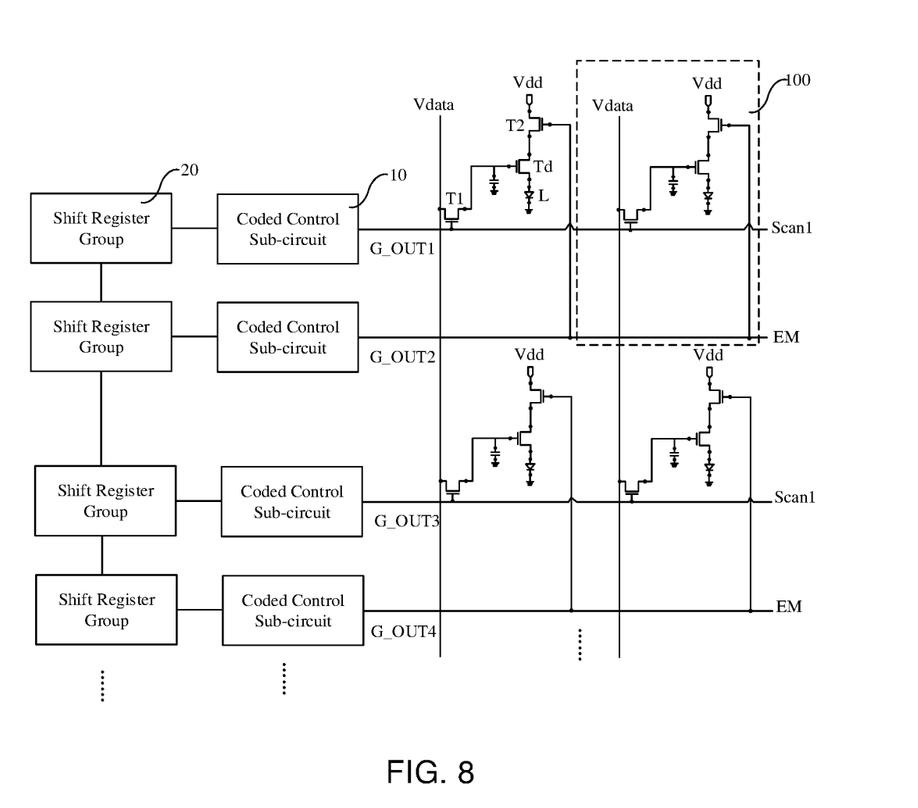
FIG. 8 is a schematic structure diagram of another display device according to some embodiments of the present disclosure.

In addition, in some other embodiments of the present disclosure, the display device may be an LED display device, which comprises a plurality of sub-pixels 100, and each sub-pixel is provided with a pixel circuit. As shown in FIG. 8, the pixel circuit has a first scan signal terminal Scan1. After the first scan signal terminal Scan1 turns on the transistor T1, the data signal Vdata is transmitted to the gate of the drive transistor Td through the transistor T1, so that the drive current generated by the drive transistor Td is supplied to the LED L.

In addition, the pixel circuit may further have a light emission control signal terminal EM as shown in FIG. 8. When the light emission control signal terminal EM turns on the transistor T2, the current supplied by the drive transistor Td may be supplied to the LED L.

It should be noted that, for convenience of description, the transistor T1 and the transistor T2 in the above LED pixel circuit are all P-type transistors. In this case, the valid signals output from the first scan signal terminal Scan1 and the light emission control signal terminal EM are at a low level.

In this case, the first scan signal terminal Scan1 and the light emission control signal terminal EM of the same pixel circuit are respectively coupled to the drive signal output terminals (for example, the drive signal output terminals G_OUT1 and G_OUT2) of the two adjacent coded control sub-circuits 10. In this case, the timings of the output signals of the first scan signal terminal Scan1 and the light emission control signal terminal EM may be set by inputting different coded signals to different coded control sub-circuits 10. That is, after the first scan signal terminal Scan1 outputs a valid signal (for example, a low level), the light emission control signal terminal EM outputs a valid signal (for example, a low level). The process of setting the coded signal is the same as described above, and details will not be described here again.

In addition, for the LED display device, in order to prevent the threshold voltage Vth of the drive transistor Td from affecting the current flowing through the drive transistor of the LED, it is necessary to compensate for the threshold voltage Vth, so that the drive current is independent of the threshold voltage Vth. In this case, it is necessary to add a transistor for compensating for the threshold voltage Vth and a scan signal terminal in the above pixel circuit.

Figure 9:
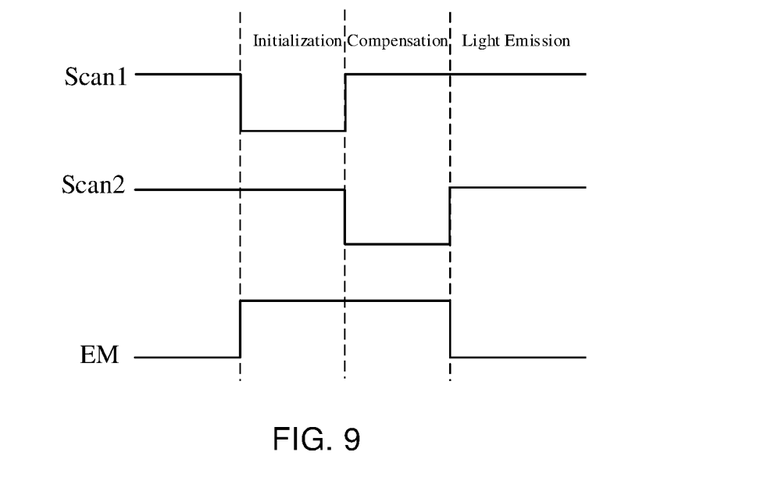
FIG. 9 is another signal control timing diagram according to some embodiments of the present disclosure.

For example, a pixel circuit having a threshold voltage compensation function has a first scan signal terminal Scan1, a second scan signal terminal Scan2, and a light emission control signal terminal EM, and the timings of the signals output from the signal terminals are as shown in FIG. 9. As may be seen from FIG. 9, in the initialization phase, the first scan signal terminal Scan1 receives a valid signal, such as a low level, to initialize the pixel circuit. In the compensation phase, the second scan signal terminal Scan2 receives a valid signal, such as a low level, to compensate for the threshold voltage Vth of the drive transistor Td in the pixel circuit. In the light emission phase, the light emission control signal terminal EM receives a valid signal, such as a low level, so that the drive current generated by the drive transistor Td flows through the LED to drive the LED to emit light.

In this case, the first scanning signal terminal Scan1, the second scanning signal terminal Scan2, and the light emission control signal terminal EM of the same pixel circuit are sequentially coupled to the drive signal output terminals G_OUT of three adjacent coded control sub-circuits 10, respectively. In this case, the timings as shown in FIG. 9 may be obtained by inputting different coded signals to different coded control sub-circuits 10. The process of setting the coded signal is the same as described above, and details will not be described here again.

It may be seen from the above that for the OLED display device, the light emission control signal terminal EM needs to be separately provided with a drive circuit to provide a signal thereto. The gate drive circuit according to the embodiments of the present disclosure may not only provide signals to the scan signal terminal, for example, the first scan signal terminal Scan1 and the second scan signal terminal Scan2, but also provide a signal to the light emission control signal terminal EM. Thus, in the display device, the circuit structure located in the wiring area around the display region is more compact and highly integrated.

It should be noted that the display device may be a display, a television, a mobile phone, a tablet or other devices having a display function.

Figure 10:
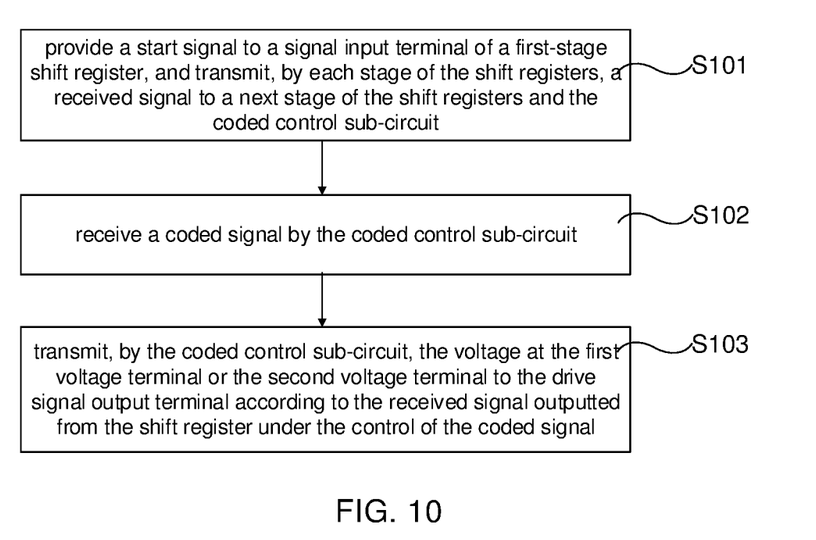
FIG. 10 is a flowchart of a method of controlling a gate drive circuit according to some embodiments of the present disclosure.

Some embodiments of the present disclosure provide a method of controlling the gate drive circuit as described above. As shown in FIG. 10, the method includes S101 to S103.

In S101, a start signal STV is supplied to the signal input terminal IN of the first-stage shift register RS1, and each stage of the shift registers transmits the received signal to the next stage of the shift registers and the coded control sub-circuit 10 coupled to the shift register.

In S102, the coded control sub-circuit 10 receives a coded signal CS.

In S103, under the control of the coded signal CS, the coded control sub-circuit 10 transmits the voltage at the first voltage terminal VGH or the second voltage terminal VGL to the drive signal output terminal G_OUT according to the signal output from the shift register coupled to the coded control sub-circuit 10.

The above control method has the same technical effects as the gate drive circuit provided in the foregoing embodiments, and details will not be described here again. The skilled in the art may understand that all or part of the steps of the above method embodiments may be implemented by using hardware related to program instructions. The program may be stored in a computer readable storage medium, and the program, when executed, may perform the steps in the foregoing method embodiments; and the storage medium may include various media that may store program codes, such as a ROM, a RAM, a magnetic disk, or an optical disk.

The foregoing is only particular embodiments of the present disclosure, but the scope of protection of the present disclosure is not limited thereto, and any person skilled in the art may easily contemplate variations or substitutions within the technical scope of the present disclosure, which should fall into the protection scope of the present disclosure. Therefore, the protection scope of the present disclosure should be defined by the appended claims.

We claim:

1. A gate drive circuit, comprising:
   a plurality of cascaded shift registers, and
   at least one coded control sub-circuit,
   wherein each stage of the shift registers is configured to transmit a received signal to a next stage of the shift registers and the coded control sub-circuit; and
   wherein the coded control sub-circuit is further coupled to a first voltage terminal, a second voltage terminal, and a drive signal output terminal; and the coded control sub-circuit is configured to receive a coded signal, and transmit a voltage at the first voltage terminal or the second voltage terminal to the drive signal output terminal according to a signal output from a shift register coupled to the control sub-circuit under the control of the coded signal,
   wherein each of the shift registers has a first output terminal and a second output terminal;
   wherein the strobe sub-circuit comprises a first strobe sub-circuit and a second strobe sub-circuit; and the output sub-circuit comprises a first output sub-circuit and a second output sub-circuit;
   wherein the first strobe sub-circuit is coupled to a first output terminal of each of a plurality of cascaded shift registers and the first output sub-circuit; and the first strobe sub-circuit is configured to transmit a signal output from the first output terminal of the at least one of the plurality of cascaded shift registers to the first output sub-circuit according to the coded signal;

wherein the second strobe sub-circuit is coupled to a second output terminal of each of the plurality of cascaded shift registers and the second output sub-circuit; and the second strobe sub-circuit is configured to transmit a signal output from the second output terminal of the at least one of the plurality of cascaded shift registers to the second output sub-circuit according to the coded signal;

wherein the first output sub-circuit is coupled to the first voltage terminal and the drive signal output terminal; and the first output sub-circuit is configured to transmit the voltage at the first voltage terminal to the drive signal output terminal according to a signal output from the first strobe sub-circuit; and wherein the second output sub-circuit is coupled to the second voltage terminal and the drive signal output terminal; and the second output sub-circuit is configured to transmit the voltage at the second voltage terminal to the drive signal output terminal according to a signal output from the second strobe sub-circuit.

2. The gate drive circuit of claim 1, wherein:

the coded control sub-circuit is further coupled to a plurality of data signal lines, the plurality of data signal lines being configured to receive coded data, respectively, and the coded data respectively received by the plurality of data signal lines being arranged in parallel to form a parallel coded signal.

3. The gate drive circuit of claim 2, wherein the gate drive circuit further comprises a serial-to-parallel sub-circuit;

wherein the serial-to-parallel sub-circuit is coupled to the plurality of data signal lines respectively; and wherein the serial-to-parallel sub-circuit is configured to receive a serial coded signal, convert the serial coded signal into the parallel coded signal, and transmit the plurality of coded data in the parallel coded signal to the plurality of data signal lines, respectively.

4. The gate drive circuit of claim 1, wherein each of the shift registers has a first output terminal and a second output terminal, the strobe sub-circuit comprises a first strobe sub-circuit and a second strobe sub-circuit, and the output sub-circuit comprises a first output sub-circuit and a second output sub-circuit, and wherein:

the plurality of cascaded shift registers comprise n shift registers cascaded sequentially;

the plurality of data signal lines comprise 2n data signal lines;

the first strobe sub-circuit comprises n transistors;

a k-th transistor of the n transistors in the first strobe sub-circuit has a gate coupled to a k-th data signal line of the 2n data signal lines, a first electrode coupled to a first output terminal of a k-th shift register of the n shift registers, and a second electrode coupled to the first output sub-circuit;

the second strobe sub-circuit comprises n transistors; and a k-th transistor of the n transistors in the second strobe sub-circuit has a gate coupled to a (n+k)-th data signal line of the 2n data signal lines, a first electrode coupled to a second output terminal of a k-th shift register of the n shift registers, and a second electrode coupled to the second output sub-circuit, where n is a positive integer, k=1~n.

5. The gate drive circuit of claim 1, wherein the first output sub-circuit comprises a first output transistor;

wherein the first output transistor has a gate coupled to the first strobe sub-circuit, a first electrode coupled to the first voltage terminal, and a second electrode coupled to the drive signal output terminal;

wherein the second output sub-circuit comprises a second output transistor; and wherein the second output transistor has a gate coupled to the second gate sub-circuit, a first electrode coupled to the second voltage terminal, and a second electrode coupled to the drive signal output terminal.

6. The gate drive circuit of claim 5, wherein the output sub-circuit further comprises a storage capacitor, a first terminal of the storage capacitor being coupled to ground, and a second terminal of the storage capacitor being coupled to the drive signal output terminal.

7. The gate drive circuit of claim 1, wherein in the plurality of cascaded shift registers of the gate drive circuit, a signal input terminal of a first-stage shift register is coupled to a start signal terminal; and wherein:

a signal input terminal of each of other shift registers than the first-stage shift register is coupled to a signal output terminal of a previous-stage shift register;

a reset signal terminal of a last-stage shift register is adapted to receive a reset signal or to be coupled to the start signal terminal; and a reset signal terminal of each of other shift registers than the last-stage shift register is coupled to a signal output terminal of a next-stage shift register.

8. The gate drive circuit of claim 7, wherein each stage of the shift registers in the gate drive circuit has a first clock signal terminal and a second clock signal terminal;

wherein the first clock signal terminal of one of two adjacent and cascaded shift registers is coupled to a first system clock signal terminal, and the second clock signal terminal of the one shift register is coupled to a second system clock signal terminal; and the first clock signal terminal of the other of the two adjacent and cascaded shift registers is coupled to the second system clock signal terminal, and the second clock signal terminal of the other shift register is coupled to the first system clock signal terminal; and wherein a clock signal output from the first system clock signal terminal has the same period and opposite phase to a clock signal output from the second system clock signal terminal.

9. A display device, comprising the gate drive circuit of claim 1.

10. The display device of claim 9, wherein the display device comprises a plurality of gate lines and a plurality of the gate drive circuits of claim 1; and the drive signal output terminals of the plurality of gate drive circuits are sequentially coupled to the plurality of gate lines one by one.

11. The display device of claim 9, wherein the display device comprises a plurality of sub-pixels, each of which is provided with a pixel circuit; the pixel circuit has a first scan signal terminal and a light emission control signal terminal; and wherein the first scan signal terminal and the light emission control signal terminal of the same pixel circuit are respectively coupled to the drive signal output terminals of two adjacent gate drive circuits.

12. The display device of claim 9, wherein the display device comprises a plurality of sub-pixels, each of which is provided with a pixel circuit; the pixel circuit has a first scan signal terminal, a second scan signal terminal and a light emission control signal terminal; and wherein the first scan signal terminal, the second scan signal terminal and the light emission control signal terminal of the same pixel circuit are sequentially coupled to drive signal output terminals of three adjacent gate drive circuits, respectively.

13. A method of controlling the gate drive circuit of claim 1, comprising:
providing a start signal to a signal input terminal of a first-stage shift register, and transmitting, by each stage of the shift registers, a received signal to the next stage of the shift registers and the coded control sub-circuit;
providing a coded signal to the coded control sub-circuit; and
transmitting, by the coded control sub-circuit, the voltage at the first voltage terminal or the second voltage terminal to the drive signal output terminal according to the received signal output from the shift register under the control of the coded signal.

14. The method of claim 13, wherein
the coded control sub-circuit is further coupled to a plurality of data signal lines, and
said providing the coded signal to the coded control sub-circuit comprises:
providing a plurality of coded data in a parallel coded signal to the plurality of data signal lines, respectively.

15. The method of claim 14, wherein providing the coded signal to the coded control sub-circuit further comprises:
receiving a serial coded signal; and
converting the serial coded signal into the parallel coded signal.

16. The method of claim 14, wherein the first clock signal terminal of one of two adjacent and cascaded shift registers is coupled to a first system clock signal terminal, and the second clock signal terminal of the one shift register is coupled to the second system clock signal terminal; and the first clock signal terminal of the other of the two adjacent and cascaded shift registers is coupled to the second system clock signal terminal, and the second clock signal terminal of the other shift register is coupled to the first system clock signal terminal, and
the method further comprises:
providing clock signals that have the same period and opposite phases to the first system clock signal terminal and the second system clock signal terminal, respectively.

* * * * *